(12) United States Patent
Zangi

(10) Patent No.: US 11,942,938 B2
(45) Date of Patent: Mar. 26, 2024

(54) RATIONAL RATIO MULTIPLIER (RRM) WITH OPTIMIZED DUTY CYCLE IMPLEMENTATION

(71) Applicant: Uzi Zangi, Hod-Hasharon (IL)

(72) Inventor: Uzi Zangi, Hod-Hasharon (IL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/566,769

(22) Filed: Dec. 31, 2021

(65) Prior Publication Data
US 2023/0216506 A1  Jul. 6, 2023

(51) Int. Cl.
*H03K 21/10* (2006.01)
*H03K 5/156* (2006.01)
*H03K 21/02* (2006.01)

(52) U.S. Cl.
CPC .......... *H03K 21/10* (2013.01); *H03K 5/1565* (2013.01); *H03K 21/026* (2013.01)

(58) Field of Classification Search
CPC ...... H03K 21/00; H03K 21/02; H03K 21/026; H03K 21/08; H03K 21/10; H03K 23/00; H03K 23/004; H03K 23/40; H03K 23/42; H03K 23/50; H03K 5/156; H03K 5/1565; G06F 1/04; G06F 1/08; G06F 1/10
See application file for complete search history.

(56) References Cited

U.S. PATENT DOCUMENTS 6,956,923 B1 * 10/2005 Younis ................... H03L 7/113
                                                              375/376
8,497,708 B2 *  7/2013 Mukherjee ............ H03D 13/00
                                                              327/12

* cited by examiner

*Primary Examiner* — Long Nguyen

(57) ABSTRACT

Design and methods for implementing a Rational Ratio Multiplier (RRM) with close to 50% duty cycle. This invention gives an optimal way to implement an RRM that saves both area and power for a given design and is able to achieve a good accuracy of the output clock with a difference between the high period and the low period of the output clock by only half a cycle of the input clock which is the closest to get to a 50% duty cycle clock.

6 Claims, 4 Drawing Sheets

RRM implementation with close to 50% duty cycle

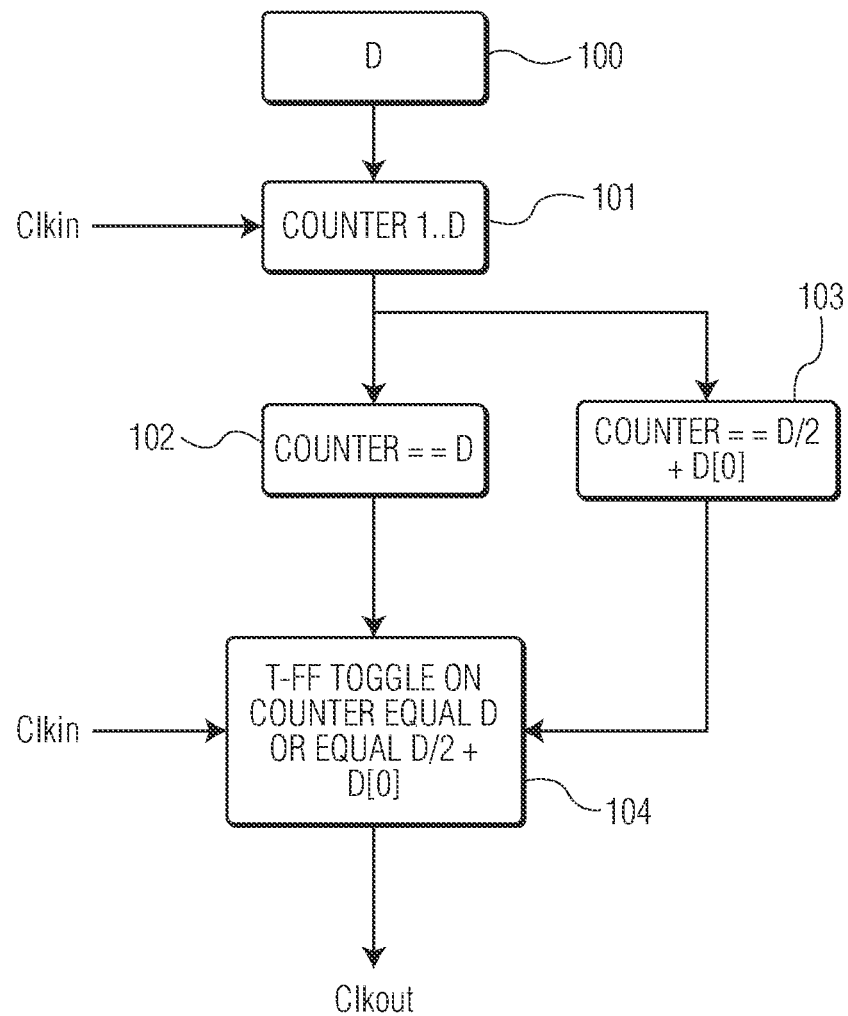
Figure 1 - Standard 1/D divider implementation
PRIOR ART

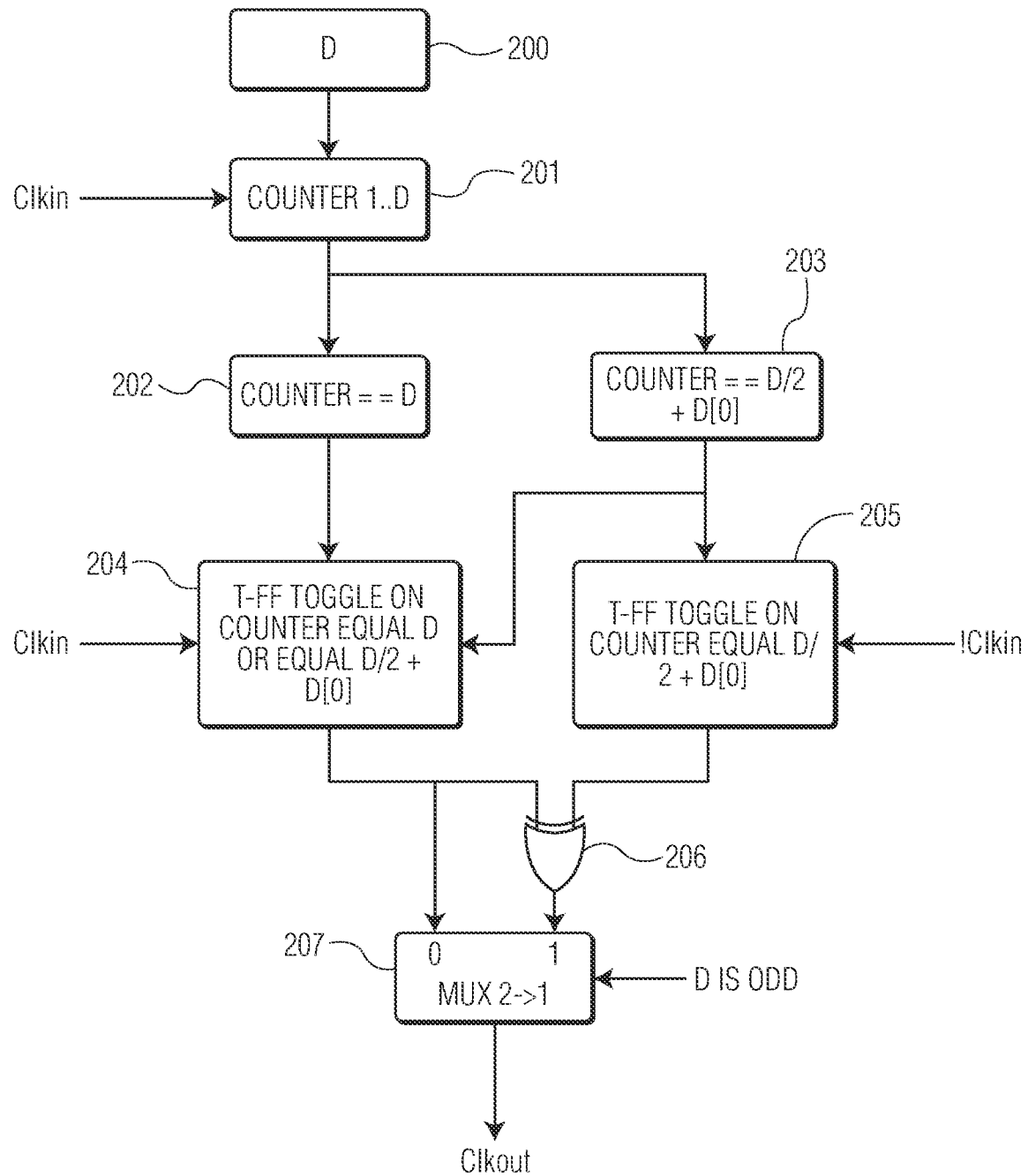
Figure 2 - 1/D divider implementation with 50% duty cycle
PRIOR ART

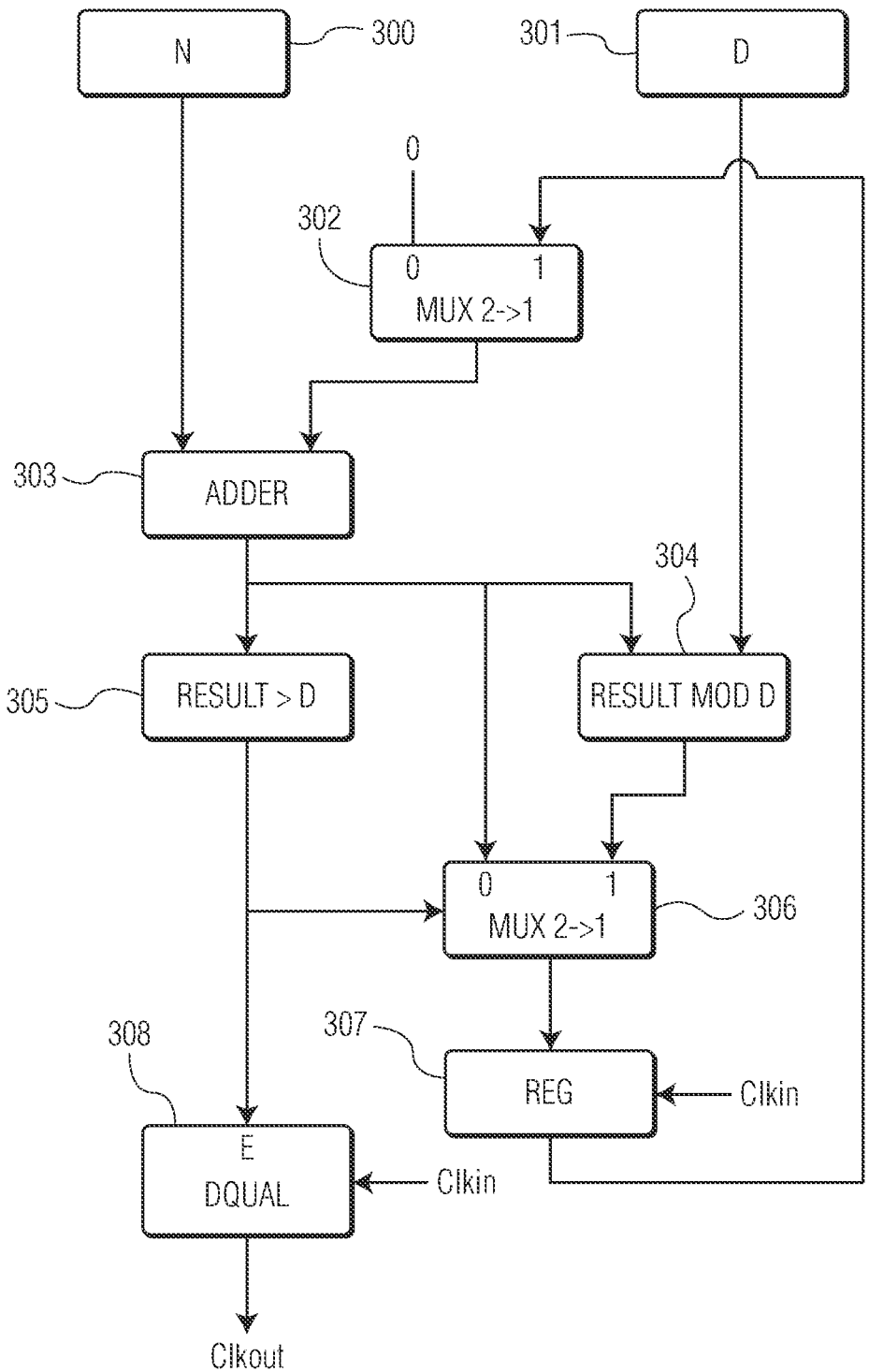
Figure 3 - RRM implementation using clock qualifier approach
PRIOR ART

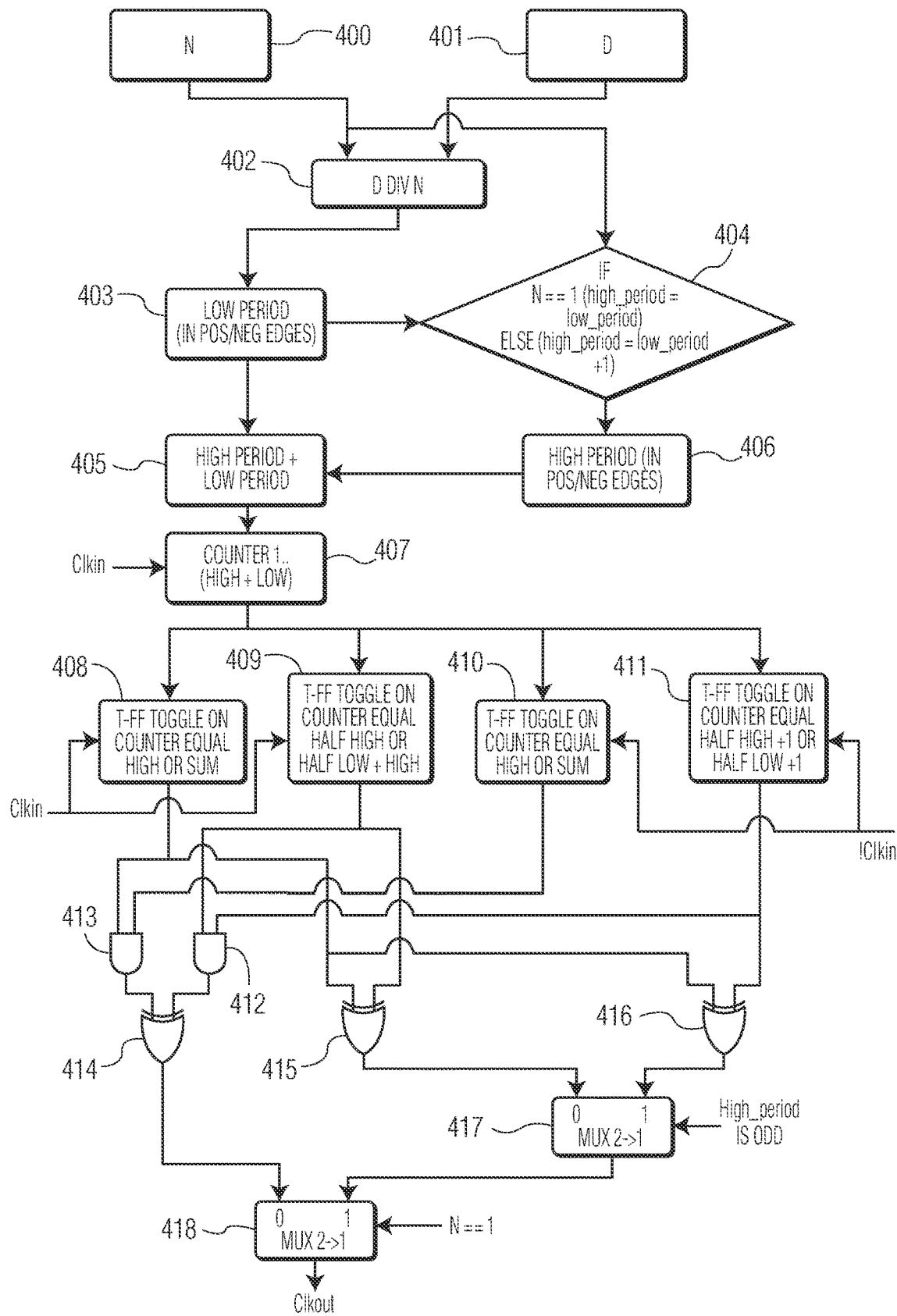
Figure 4 - RRM implementation with close to 50% duty cycle

RATIONAL RATIO MULTIPLIER (RRM) WITH OPTIMIZED DUTY CYCLE IMPLEMENTATION

FIELD

This invention relates generally to the field of Semiconductor Integrated Circuit design, and more specifically to a design implementation of Rational Ratio Multiplier (RRM).

BACKGROUND OF THE INVENTION

As Semiconductor Integrated Circuits become more complex and the implementation of complex SoCs (with SoC standing for System On a Chip) become widely used, there are many different blocks and interfaces inside the chip which require different and accurate clock frequencies.

Using a dedicated clock source such as crystal or PLL per each required clock frequency isn't optimal for both power and area of the silicon, thus there is a need to use one fast frequency clock source and to have a clock divider which can divide the fast clock source frequency to any required sub-frequency with good accuracy. In order to get to an accurate clock frequency, this divider needs to make a rational divide and for this there is a need to use a Rational Ratio Multiplier (RRM) which can give an accurate division and also a good duty cycle such that any logic which relies also on the falling edge of the clock can still operate.

This invention shows an optimized implementation of an RRM with close to 50% duty cycle for giving different rational ratios of N/D in which D>N.

BRIEF DESCRIPTION OF THE DRAWINGS

FIG. 1 shows a divider according to the prior art.
FIG. 2 shows a divider according to the prior art.
FIG. 3 shows an RRM implementation according to the prior art.
FIG. 4 shows a new RRM implementation.

PRIOR ART

Standard 1/D Divider Implementation—FIG. 1

This simple divider will divide the clock by the 1/D ratio with a duty cycle of 50% when D is even, and with one input-clock cycle width difference when D is odd. The divider uses a counter which counts from 1 to D (box 101 in FIG. 1) and two comparators which compare the counter to D (box 102 in FIG. 1) and D/2 when D is even or D/2+1 when D is odd (box 103 in FIG. 1). When one of these two comparators finds an equal result, a toggle Flip-Flop (T-FF) (box 104 in FIG. 1) changes its state to generate the output clock. Because this T-FF is working only on the rising edge of the clock, we get a 50% duty cycle when D is even and one input-clock cycle difference between the high and the low of the output clock when D is odd.

1/D Divider Implementation with 50% Duty Cycle—FIG. 2

This divider will divide the clock by the 1/D ratio with a duty cycle of 50% even when the D is odd by working on both rising and falling edges of the input clock. The divider uses a counter which counts from 1 to D (box 201 in FIG. 2) and two comparators which compare the counter to D (box 202 in FIG. 2) and D/2 when D is even or D/2+1 when D is odd (box 203 in FIG. 2). When one of these two comparators finds an equal result, a T-FF which works at the rising edge of the input clock (box 204 in FIG. 2) changes its state to generate the output clock in case D is even. Another T-FF which works at falling edge of the input clock (box 205 in FIG. 2) changes its state when the counter is equal D/2+1 when D is odd. A XOR (box 206 in FIG. 2) between the first T-FF which samples at the rising edge and the second T-FF which samples at the falling edge generates the output clock when D is odd. A multiplexer (box 207 in FIG. 2) selects the output of the first T-FF which samples at the rising edge or the output of the XOR depending if D is even or odd.

Because the two T-FFs are working one on the rising edge of the input clock and the other on the falling edge of the input clock, we get a 50% duty cycle even when D is odd and not like the 1/D implementation in FIG. 1.

The disadvantage of the 1/D divider is that it can't give an accurate frequency on the output as it can support only division by D of the input clock frequency and not by N/D as the RRM implementation does.

RRM Implementation Using Clock Qualifier Approach—FIG. 3

This RRM implementation creates a qualified clock pulse of the input clock at the multiplication ratio of N/D. The high pulse width of this RRM remains always one cycle of the input clock and if any logic in the design is working with the falling edge of the output clock it will be required to meet the timing constraints of the input clock which is faster than the timing constraint of the output clock.

The RRM is programmed by receiving the value of N (box 300 in FIG. 3) and D (box 301 in FIG. 3). An adder (box 303 in FIG. 3) adds at each rising edge of the input clock the value of N to the previous output of the adder which comes from the multiplexer (box 302 in FIG. 3). The multiplexer chooses between passing a zero at the beginning of the count or the stored value of a register otherwise (box 304 in FIG. 3). The register value is set according to the previous cycle's result—when the previous cycle's output of the adder is greater than D, then the register will sample the result of the adder modulo (box 304 in FIG. 3). When the previous cycle's output of the adder is less than D, the register will sample the adder output.

Whenever the adder result is greater than D, the clock qualifier (box 308 in FIG. 3) will receive an enable signal and pass one cycle of the input clock to the output clock. Using this method, we receive for every D cycles of the input clock, N cycles on the output clock.

DESCRIPTION OF THE INVENTION

To get an RRM which can work on any fractional ratio and give close to 50% duty cycle, a new implementation is proposed which performs this accurate clock multiplication.

This invention may be used by any system which requires an accurate clock multiplication using a rational fraction ratio and requires an output clock with close to 50% duty cycle so any negative edge logic which uses this clock can work with timing constraint of the output clock.

This invention has been described as including various operations. Many of the processes are described in their most basic form, but operations can be added to or deleted from any of the processes without departing from the scope of the invention.

RRM Implementation with Optimized Duty Cycle—FIG. 4

The RRM implementation under this invention generates an output clock with cycle time which is the multiplication of the input clock by the fraction rational ratio of N/D while D>N.

The duty cycle of the resulted output clock is close to 50% with a difference of only one half a cycle of the input-clock between the high period and the low period of output clock.

The implementation under this invention is programmed by receiving the value of N (box 400 in FIG. 4) and D (box 401 in FIG. 4). The RRM implementation calculates the low period (box 403 in FIG. 4) which is the number of rising and falling edges of the input clock pulses that the output clock should be at zero and the high period (box 406 in FIG. 4) which is the number of rising and falling edges of the input clock pulses that the output clock should be at one. The low period is calculated according to the result of the D DIV N calculation (box 402 in FIG. 4). The high period equals to the low period if N==1 (this is the same as the implementation of a 1/D divider) or equals to the low period plus one (as shown with box 404 in FIG. 4).

In addition to the above, this invention includes a counter which counts from 1 to the sum of low period+high period (box 407 in FIG. 4) using the rising edge of the input clock.

Connected to this counter are 4 T-FF's which 2 of them are sampling on the rising edge of input clock and the other two on the falling edge of input clock. These FF's are toggling when the counter equals to the following values:

The first T-FF (box 408 in FIG. 4) which samples at the rising edge of input clock toggles when the counter equals the high period or the sum of both the high and low periods.

The second T-FF (box 409 in FIG. 4) which samples at the rising edge of input clock toggles when the counter equals to half of the high period or the half of the sum of both the high and low periods.

The third T-FF (box 410 in FIG. 4) which samples at the falling edge of input clock toggles when the counter equals to the high period or the sum of both the high and low periods.

The fourth T-FF (box 411 in FIG. 4) which samples at the falling edge of input clock toggles when the counter equals to the half of the high period+1 or the half of the sum of both the high and low periods+1

When N isn't equal to 1 (this means that the implementation isn't a 1/D implementation) then the output clock is generated by a XOR (box 414 in FIG. 4) with one AND function between the first T-FF and the third T-FF (box 413 in FIG. 4) with another AND function between the second T-FF and the fourth T-FF (box 412 in FIG. 4).

When N is equal to 1 (this means that the implementation is a 1/D implementation), the output clock is generated either by a XOR of the first T-FF with the fourth T-FF (box 416 in FIG. 4) when the high period is odd, or by a XOR of the first T-FF with the second T-FF (box 415 in FIG. 4) when the high period is even. The selection between these two XOR's is done by a multiplexer (box 417 in FIG. 4) which generates the output clock if N is equal to 1.

The last multiplexer on the output (box 418 in FIG. 4) is selecting the correct clock between the above two implementations depending on whether N is equal to 1 or not.

What is claimed:

1. An apparatus comprising:
    a Rational Ratio Multiplier (RRM) implementation comprising:
        a first input to receive a first value N;
        a second input to receive a second value D, wherein the value N and the value D provide a rational ratio fraction N/D while D>N of the RRM;
        a counter, the counter configured to count from 1 to a sum of a high period value and a low period value, wherein the high period value is defined by a desired number of rising edges and falling edges of an input clock while an output clock is at a high clock period and the low period value is defined by a desired number of rising edges and falling edges of the input clock while the output clock is at a low clock period, wherein the low period value and the high period value are derived from the N value and the D value;
        a first T-FF that samples at a rising edge of the input clock;
        a second T-FF that samples at the rising edge of the input clock;
        a third T-FF that samples at a falling edge of the input clock;
        a fourth T-FF that samples at the falling edge of the input clock;
        wherein the first T-FF, the second T-FF, the third T-FF, and the fourth T-FF are configured to toggle based a count of the counter;
        a logic circuit configured to receive output signals of the first T-FF, the second T-FF, the third T-FF, and the fourth T-FF and generate from the output signals the output clock.

2. An apparatus of claim 1, wherein the high period value is equal to the low period value when the N value is equal to 1, wherein the high period value is larger by 1 than the low period value when the N value is greater than 1.

3. An apparatus of claim 1, wherein when the N value is not equal to 1, the logic circuit is configured to generate the output clock by a XOR function between one AND function of an output of the first T-FF and an output of the third T-FF with another AND function of an output of the second T-FF and an output of the fourth T-FF.

4. An apparatus of claim 1, wherein when the N value is equal to 1, the logic circuit is configured to generate the output clock by a XOR function of an output of the first T-FF with an output of the fourth T-FF when the high period value is odd, and by a XOR function of the output of the first T-FF with an output of the second T-FF when the high period value is even.

5. The apparatus of claim 1 wherein:
    the first T-FF includes a clock input configured to receive the input clock;
    the second T-FF includes a clock input configured to receive the input clock;
    the third T-FF includes a clock input configured to receive a second clock that is inverse to the input clock;
    the fourth T-FF includes a clock input configured to receive the second clock.

6. An apparatus of claim 1, wherein;
    the first T-FF is configured to toggle when the count of the counter equals the high period value and when the count of the counter equals the sum of both the high period value and the low period value;
    the second T-FF is configured to toggle when the count of the counter equals half of the high period value and when the count of the counter equals half of the sum of both the high period value and the low period value;
    the third T-FF is configured to toggle when the count of the counter equals the high period value and when the count of the counter equals the sum of both the high period value and low period value;
    the fourth T-FF is configured to toggle when the count of the counter equals half of the high period value+1 and when the count of the counter equals half of the low period value+1.

* * * * *